(12) United States Patent
Takahashi et al.

(10) Patent No.: US 7,682,481 B2
(45) Date of Patent: Mar. 23, 2010

(54) VACUUM PROCESSING APPARATUS

(75) Inventors: Seiichi Takahashi, Shizuoka (JP); Takehisa Miyaya, Shizuoka (JP); Soo Boo Lim, Shizuoka (JP); Masayuki Satou, Shizuoka (JP); Kengo Tsutsumi, Shizuoka (JP); Yohei Ono, Shizuoka (JP)

(73) Assignee: Ulvac, Inc., Chigasaki-shi (JP)

( * ) Notice: Subject to any disclaimer, the term of this patent is extended or adjusted under 35 U.S.C. 154(b) by 0 days.

(21) Appl. No.: 11/646,593

(22) Filed: Dec. 28, 2006

(65) Prior Publication Data

US 2007/0151669 A1 Jul. 5, 2007

Related U.S. Application Data

(63) Continuation of application No. PCT/JP2005/011808, filed on Jun. 28, 2005.

(30) Foreign Application Priority Data

Jun. 30, 2004 (JP) .............................. 2004-193569

(51) Int. Cl.
  *C23F 1/00* (2006.01)
  *C23C 16/00* (2006.01)
(52) U.S. Cl. .................. 156/345.31; 118/719
(58) Field of Classification Search .............. 118/719; 156/345.31
  See application file for complete search history.

(56) References Cited

U.S. PATENT DOCUMENTS 4,886,592 A * 12/1989 Anderle et al. ......... 204/298.25

FOREIGN PATENT DOCUMENTS

| JP | 01-257193 A | * | 10/1989 |
|----|----|----|----|
| JP | 06-267808 | * | 9/1994 |
| JP | 8-111449 | | 4/1996 |
| JP | 2000-182967 | | 6/2000 |
| JP | 2000-273631 | | 10/2000 |
| JP | 2001-35842 | | 2/2001 |
| JP | 2002-280438 | | 9/2002 |

OTHER PUBLICATIONS

International Search Report and translation dated Aug. 23, 2005.

* cited by examiner

*Primary Examiner*—Michael Cleveland
*Assistant Examiner*—Nathan K Ford
(74) *Attorney, Agent, or Firm*—Kratz, Quintos & Hanson, LLP

(57) ABSTRACT

The present invention provides a vacuum processing apparatus that allows easy exchange of processing chambers. A vacuum processing apparatus of the present invention has a processing chamber and a carrying-in-and-out chamber. The carrying-in-and-out chamber is fixed and located at a position above the processing chamber. The processing chamber can be lowered by a vertically moving mechanism. Therefore, the processing chamber is separated from the carrying-in-and-out chamber by lowering the processing chamber. A conveying means is connected to the processing chamber so that it is possible to easily convey the processing chamber after being removed from the carrying-in-and-out chamber. The operation for exchanging the processing chambers can be simpler than in the conventional systems.

9 Claims, 5 Drawing Sheets

VACUUM PROCESSING APPARATUS

This is a Continuation of International Application No. PCT/JP2005/011808 filed Jun. 28, 2005. The entire disclosure of the prior application is hereby incorporated by reference herein in its entirety.

BACKGROUND OF THE INVENTION

1. Field of the Invention

The present invention generally relates to techniques of vacuum processing apparatuses.

2. Discussion of the Relevant Art

Reference numeral 101 in FIG. 5 shows a conventional vacuum processing apparatus. The vacuum processing apparatus 101 has a carrying-in-and-out chamber 110 and a processing chamber 130.

The processing chamber 130 is connected to the carrying-in-and-out chamber 110 in an airtight manner at a position above the carrying-in-and-out chamber 110 so that a substrate disposed inside the carrying-in-and-out chamber 110 can be carried into and out the inside of the processing chamber 130 without exposing the substrate to the outside air.

A plurality of substrates can be disposed inside the carrying-in-and-out chamber 110. The substrate subjected to etching inside the processing chamber 130 is returned from the processing chamber 130 to the carrying-in-and-out chamber 110; and thereafter, another substrate that has not been subjected to etching is carried into the processing chamber 130.

After repeating etching a number of times, the inside of the processing chamber 130 is contaminated by a processing gas. Therefore, after a set number of times of etching, etching is suspended. Then, the processing chamber 130 is removed from the carrying-in-and-out chamber 110, and a new processing chamber 130 is attached to the carrying-in-and-out chamber 110. After that, etching process is restarted.

The operation for removing a component attached to an exterior wall of the processing chamber 130 so as to separate the processing chamber 130 from the carrying-in-and-out chamber 110 is performed manually. Since the processing chamber 130 is disposed above the carrying-in-and-out chamber 110, people use steps or the like to perform the removing operation. However, since the processing chamber 130 is extremely heavy, the removing operation for the processing chamber 130 that is located in a high place has been dangerous.

In particular, due to recent increase in the substrate size, the processing chamber 130 also is getting larger, which makes an exchange operation of the processing chamber 130 significantly dangerous. The above-mentioned related art is disclosed in Japanese Patent Laid-Open Publication 2000-182967.

The present invention was achieved to solve the above problems in the conventional systems, and the object thereof is to provide a vacuum processing apparatus that allows an easy operation for exchanging processing chambers.

SUMMARY OF THE INVENTION

In order to solve the above problems, the present invention provides a vacuum processing apparatus that includes a processing chamber for processing a substrate in a vacuum atmosphere, and a carrying-in-and-out chamber that is connected to the processing chamber at a position above the processing chamber. The carrying-and-out chamber can carry a substrate inside from an external atmosphere, in which the substrate is carried between the carrying-in-and-out chamber and the processing chamber. The processing chamber can be removed from the carrying-in-and-out chamber with maintaining the vertical positional relationship between the processing chamber and the carrying-in-and-out chamber.

The present invention provides the vacuum processing apparatus in which the substrate is carried between the carrying-in-and-out chamber and the processing chamber without being exposed to the external atmosphere.

The present invention provides the vacuum processing apparatus that includes a conveying means that is connected to the processing chamber, and conveys the processing chamber that has been removed from the carrying-in-and-out chamber, in which the conveying means is connected to the processing chamber even in a state in which the processing chamber is connected to the carrying-in-and-out chamber.

The present invention provides the vacuum processing apparatus wherein a gas supply system is connected to the processing chamber in a state in which the processing chamber is connected to the carrying-in-and-out chamber; and when a radical and a processing gas of the gas supply system are supplied to the inside of the processing chamber, the processing gas and a substance to be processed on the surface of the substrate react with each other so that the substance is removed from the surface of the substrate.

The present invention is comprised as described above. The vacuum processing apparatus of the present invention can carry a substrate from the carrying-in-and-out chamber to the processing chamber or can carry the substrate from the processing chamber to the carrying-in-and-out chamber.

The substrate may be carried in a state in which the substrate is exposed to the air by connecting the processing chamber and the carrying-in-and-out chamber to the external atmosphere. However, the substrate is not contaminated by water or oxygen in the air when the substrate is carried without being exposed to the air by shutting off the processing chamber and the carrying-in-and-out chamber from the external atmosphere.

In the present invention, since the processing chamber is disposed just below the carrying-in-and-out chamber, it is easy to remove the processing chamber, which is heavy; and therefore, the removing operation can be performed safely. In addition, since the processing chamber and the carrying-in-and-out chamber are separated while maintaining their vertical positional relationship, the removing operation does not require a large space and has a simple removal process. Therefore, the operation time is shortened to approximately half that of the conventional operation time. A conveying means is connected to the processing chamber. When the processing chamber is lowered, the conveying means is lowered together. In a state in which the processing chamber is separated, the conveying means is in contact with the floor surface, and the processing chamber can be easily conveyed by the conveying means.

DETAILED DESCRIPTION OF THE INVENTION

Figure 1:
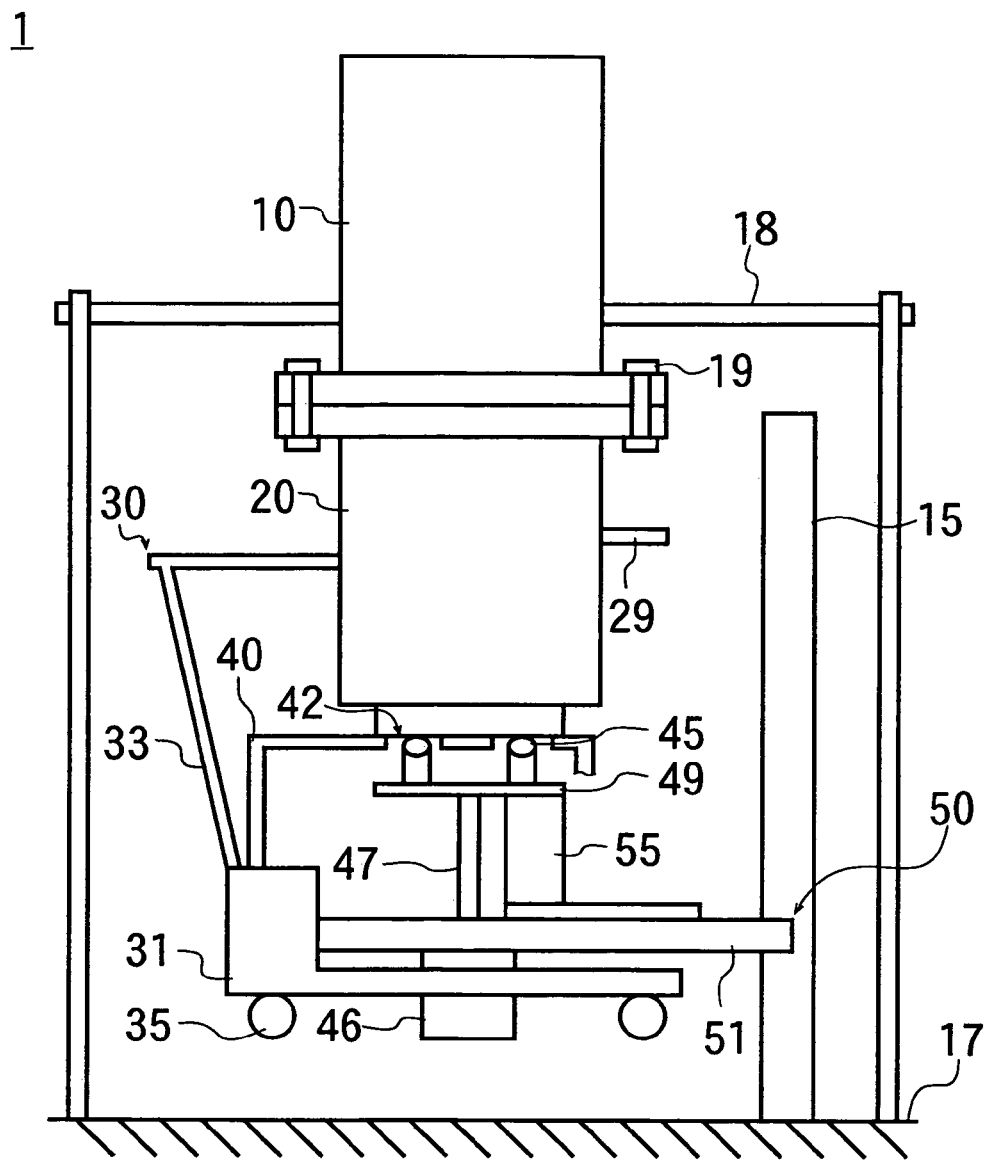
FIG. 1 is a diagram illustrating a vacuum processing apparatus of the present invention.

The reference numeral 1 in FIG. 1 generally shows a vacuum processing apparatus of the present invention, and the vacuum processing apparatus 1 has a carrying-in-and-out chamber 10, a processing chamber 20 and a vertically moving mechanism 50. The carrying-in-and-out chamber 10 is fixed and located at a high position above a floor surface 17 of an operation room by a supporting member 18.

The vertically moving mechanism 50 has a support plate 51. A pole-shaped framework 15 is provided in a standing manner on the floor surface 17, and the support plate 51 is fixed to the framework 15 with its surface kept substantially horizontal. The processing chamber 20 is placed on balls 45 described later, and fixed to the framework 15 via the support plate 51.

The processing chamber 20 and the carrying-in-and-out chamber 10 respectively have an opening portion, and the opening portion of the carrying-in-and-out chamber 10 faces downward. In a state that the processing chamber 20 is fixed to the framework 15, the opening portion of the processing chamber 20 faces upward. The opening portions of the processing chamber 20 and the carrying-in-and-out chamber 10 are in close contact with an o-ring being interposed therebetween, and fixed by a positioning pin 19. After that, the inside of the carrying-in-and-out chamber 10 and the inside of the processing chamber 20 are evacuated, so that the opening portions are hermetically closed. As a result, the carrying-in-and-out chamber 10 and the processing chamber 20 are connected to each other in an airtight manner. The opening portions of the processing chamber 20 and the carrying-in-and-out chamber 10 are substantially parallel to the floor 17, as shown by FIG. 1.

A partitioning valve is provided at the opening portion of the carrying-in-and-out chamber 10. When the partitioning valve is open, the internal space of the carrying-in-and-out chamber 10 is connected to the internal space of the processing chamber 20; and the substrate can be carried in and out of the carrying-in-and-out chamber 10 and the processing chamber 20.

Next, a process for processing substrates using the vacuum processing apparatus 1 is described. An evacuation system (not shown) is connected respectively to the processing chamber 20 and the carrying-in-and-out chamber 10; and a vacuum atmosphere with a predetermined pressure is formed inside the processing chamber 20 and the carrying-in-and-out chamber 10 by the evacuation.

Inside the carrying-in-and-out chamber 10, a carrying board is disposed in advance and a plurality of substrates is contained on the carrying board. When the partitioning valve is opened and the carrying board is lowered so as to be conveyed from the carrying-in-and-out chamber 10 to the processing chamber 20, a lid portion, which is an upper end portion of the carrying board, fits into the opening portion of the processing chamber 20; thereby, shutting off the internal space of the processing chamber 20 from the internal space of the carrying-in-and-out chamber 10.

A long and narrow applicator 29 for generating a radical ($H^+$) is attached on the exterior wall of the processing chamber 20 in a substantially horizontal manner. The radicals generated by the applicator 29 are supplied to the inside of the processing chamber 20.

A processing gas supply system is connected to the processing chamber 20. When a processing gas ($NF_3$ gas for example) from the processing gas supply system and the radical generated by the applicator 29 are supplied to the processing chamber 20 while performing evacuation, a natural oxide film on the substrate (in this case, a silicon oxide film) reacts with the processing gas and the radical, and a reaction product (in this case, $NH_4SiF_6$) is produced.

Further, by heating the substrate with a lamp heater, the reaction product is decomposed and is removed from the surface of the substrate as a result of the reaction product turning into gas, and discharged by evacuation from inside of the processing chamber 20 (etching process).

After etching, the carrying board is lifted up so as to return the substrate to the carrying-in-and-out chamber 10; and the carrying board containing unprocessed substrates is lowered into the processing chamber 20; thereby, exchanging substrates. By repeating the etching process described above and the exchange of substrates, it is possible to successively etch a plurality of substrates.

Due to repeated etching, the inside of the processing chamber 20 is gradually contaminated by the processing gas; and therefore, it is necessary to exchange the processing chamber 20.

The process for exchanging the processing chamber 20 is described below. After etching of a predetermined number of substrates is completed and the etched substrates are returned to the carrying-in-and-out chamber 10, the partitioning valve is closed, and the pressure inside the processing chamber 20 is lowered to a predetermined pressure by the evacuation so as to completely remove the gas used for the etching process.

The vertically moving mechanism 50 has a cylinder 46, a support shaft 47 and the balls 45. The cylinder 46 is attached to the support plate 51 below the support plate 51, and the lower end of the support shaft 47 is connected to the cylinder 46, and the upper end of the support shaft 47 protrudes upward from the support plate 51.

An attachment plate 49 is attached to the upper end of the support shaft 47, and the balls 45 are disposed on the attachment plate 49. In a state in which the processing chamber 20 is connected to the carrying-in-and-out chamber 10, the balls 45 are pushed against the bottom wall of the processing chamber 20; thereby, supporting the processing chamber 20. As a result, in a state in which the processing chamber 20 is connected to the carrying-in-and-out chamber 10, the processing chamber 20 is fixed to the framework 15 via the support plate 51 while being placed on the balls 45.

Figure 2A:
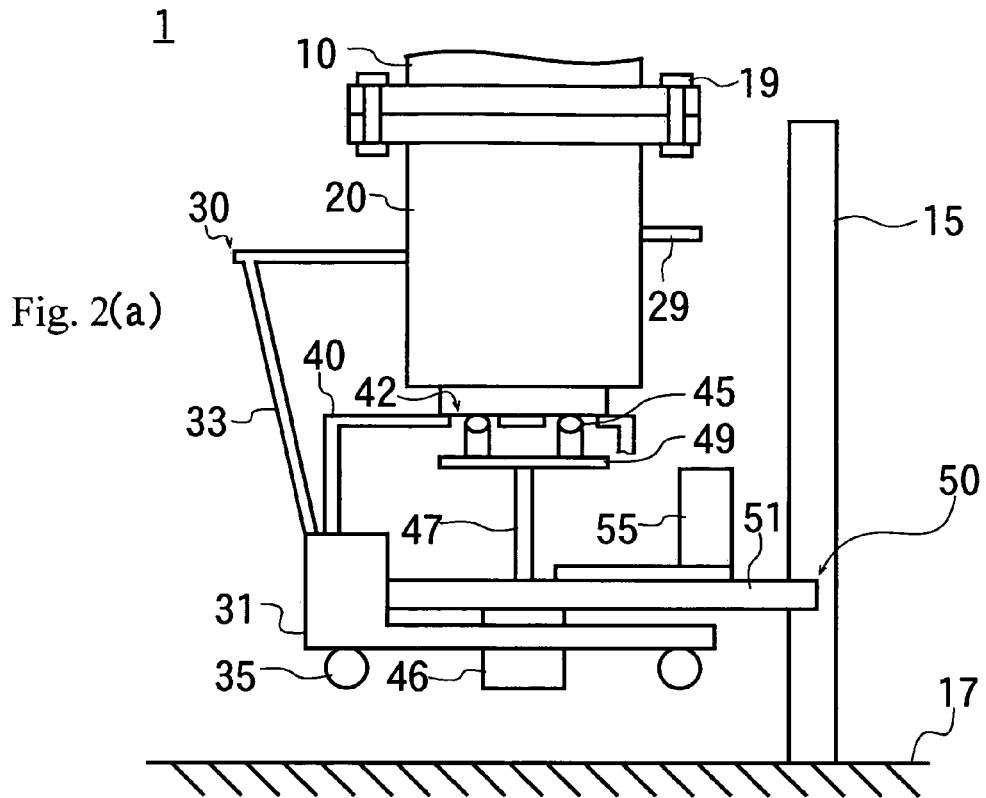
FIGS. 2(a) and 2(b) are diagrams illustrating an early stage of a process for exchanging processing chamber.
Figure 2B:
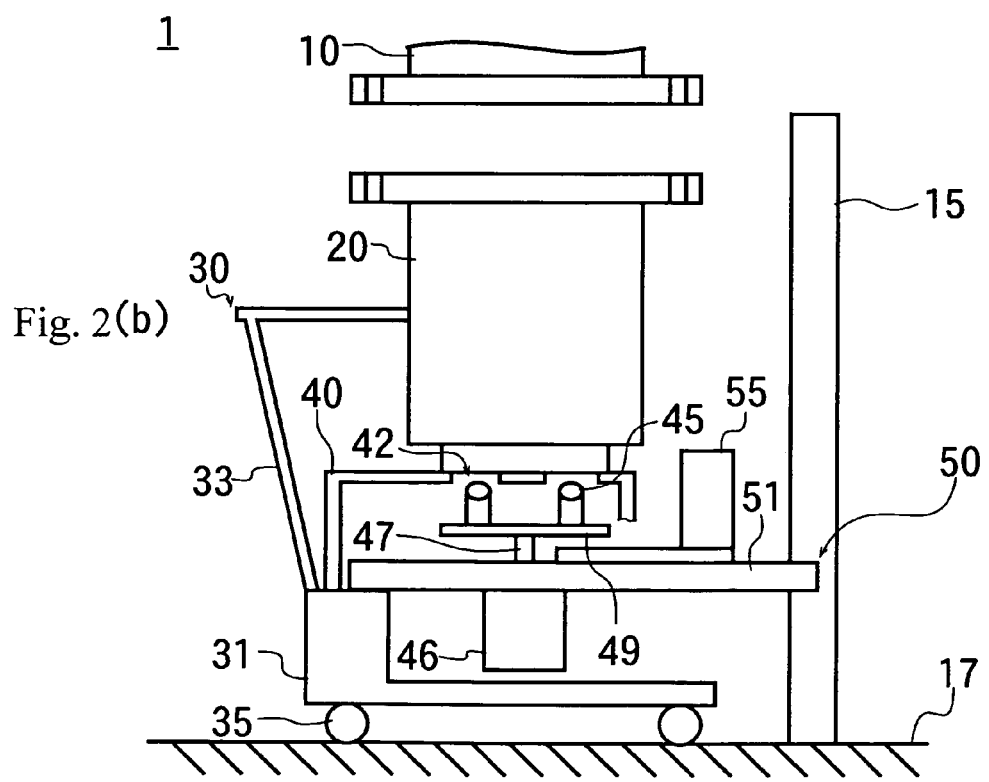

A block 55 for preventing falling that can move horizontally is disposed on the support plate 51. In a state that the processing chamber 20 is connected to the carrying-in-and-out chamber 10, the block 55 is disposed below the attachment plate 49. In order to exchange the processing chamber 20, initially, the block 55 is moved horizontally on the support plate 51 such that the block 55 leaves from the position below the attachment plate 49 (FIG. 2(*a*)).

When a heating means for heating substrates is attached to the processing chamber 20, power supply to the heating means is cut; and when a cooling device for cooling the processing chamber 20 is attached to the processing chamber 20, the operation of the cooling device is stopped. Thereafter, wiring connectors for supplying the electric power to the cooling device and the heating means are removed.

The processing chamber 20 is provided with pipes for connecting the piping of the evacuation system, the piping of the processing gas supply system, and the piping of the applicator 29 to the processing chamber 20. In a state in which the partitioning valves provided in the pipes are closed so as to shut off the evacuation system, the processing gas supply system and the applicator 29 from the processing chamber 20, $N_2$ gas is introduced into the processing chamber 20 such that the interior atmosphere of the processing chamber 20 is returned to the atmospheric pressure. Thereafter, each piping is removed.

The opening portion of the processing chamber 20 is in close contact with the opening portion of the carrying-in-and-out chamber 10. When the positioning pin 19 is removed and the cylinder 46 is operated so as to lower the support shaft 47 in a state in which the inside of the processing chamber 20 is returned to the atmospheric pressure, the processing chamber 20 is lowered together with the balls 45. At this time, since the carrying-in-and-out chamber 10 is fixed by the support member 18, the carrying-in-and-out chamber 10 remains above the processing chamber 20; and consequently, the processing chamber 20 is separated from the carrying-in-and-out chamber 10.

The vacuum processing apparatus 1 has a conveyor or conveying means 30. The conveying means 30 has a plate-shaped base 31. The surface of the base 31 faces the processing chamber 20, and the back surface of the base 31 faces the floor surface 17. A pole-shaped handle 33 is provided on the surface of the base 31 in a standing manner, and the upper end of the handle 33 bended to be fixed to a side wall of the processing chamber 20. Therefore, the conveying means 30 is fixed to the processing chamber 20, and when the chamber 20 is lowered, the conveying means 30 is lowered together.

Wheels 35 are attached to the back surface of the base 31. Before the processing chamber 20 is lowered, the wheel 35 is not in contact with the floor surface 17 and floats in the air. However, when the conveying means 30 is lowered together with the processing chamber 20, the wheel 35 contacts the floor surface 17.

On the surface of the base 31, a holding plate 40 is fixed so as to be located above the attachment plate 49. The holding plate 40 has an opening 42 having a diameter larger than that of the ball 45.

When the wheel 35 contacts the floor surface 17, although the base 31 and the holding plate 40 are not lowered any further, the ball 45 is further lowered passing through the opening 42 to a level lower than the holding plate 40. The load of the processing chamber 20 is carried on the holding plate 40 instead of the ball 45; and consequently, the processing chamber 20 is supported by the conveying means 30 (FIG. 2(*b*)).

Figure 3A:
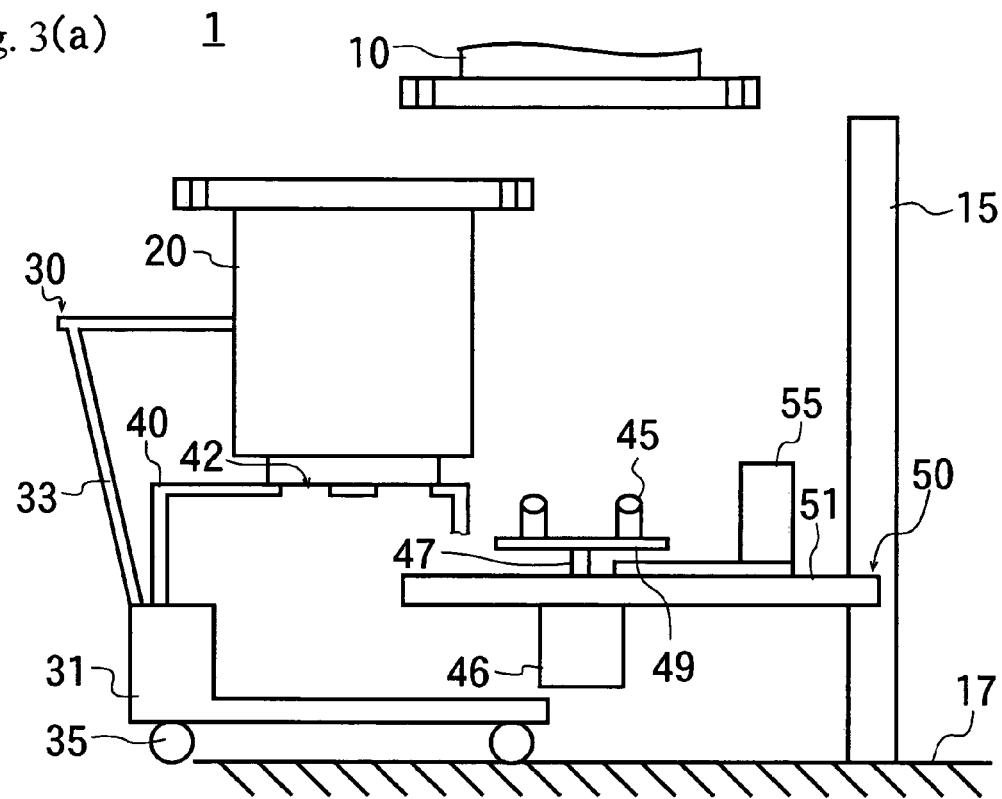
FIGS. 3(a) and 3(b) are diagrams illustrating the middle stage of the process for exchanging processing chamber.
Figure 3B:
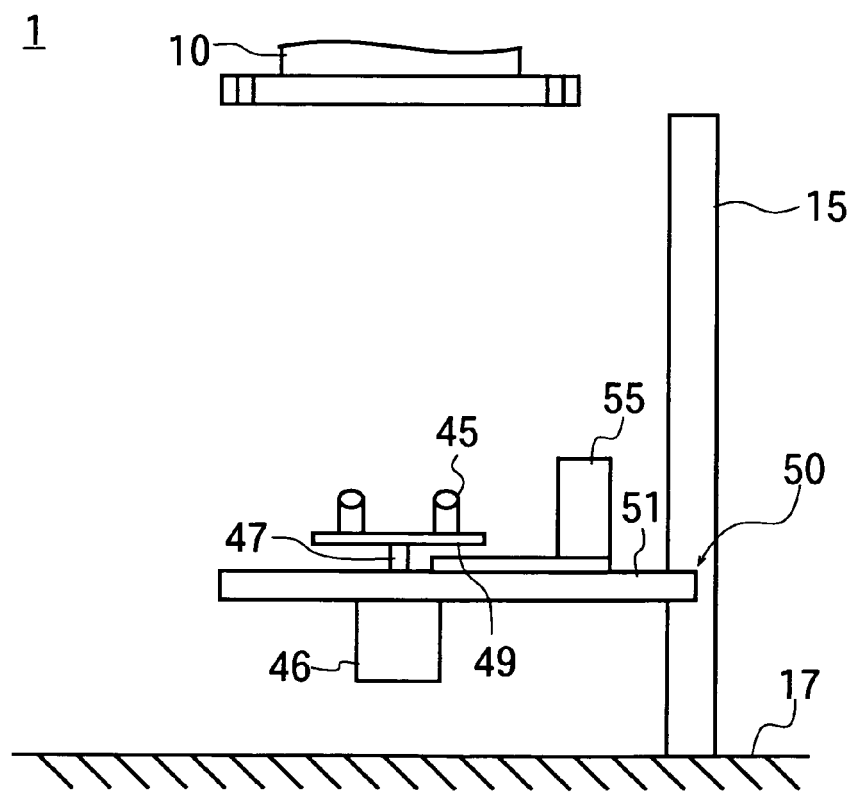

After the processing chamber 20 is placed on the holding plate 40, the wheel 35 rotates by pulling the handle 33. As shown in FIG. 3(*a*), the processing chamber 20 and the conveying means 30 move together from the position just below the carrying-in-and-out chamber 10 so that the processing chamber 20 is removed from the carrying-in-and-out chamber 10.

FIG. 3(*b*) shows a state in which the processing chamber 20 is removed from the carrying-in-and-out chamber 10. The vertically moving mechanism 50 is separated from the processing chamber 20, and is left just below the carrying-in-and-out chamber 10 with the support plate 51 being fixed to the framework 15. The removed processing chamber 20 is subjected to maintenance such as washing the inside thereof in a separate room after being removed from the conveying means 30.

Next, a process for connecting the processing chamber 20 prior to use in etching or after the maintenance work to the carrying-in-and-out chamber 10 is described. Initially, the processing chamber 20 is placed on the holding plate 40 of the conveying means 30, and the handle 33 is fixed to a side wall of the processing chamber 20. In such a state, the vertically moving mechanism 50 is fixed to the framework 15, and by pushing the handle 33, the conveying means 30 is moved along with the processing chamber 20 to a position below the carrying-in-and-out chamber 10 (FIG. 4(*a*)).

By placing the opening portion of the processing chamber 20 just below the opening portion of the carrying-in-and-out chamber 10, operating the cylinder 46 in that state, and lifting the ball 45 to a level higher than the holding plate 40, the processing chamber 20 is consequently placed on the ball 45.

Figure 4A:
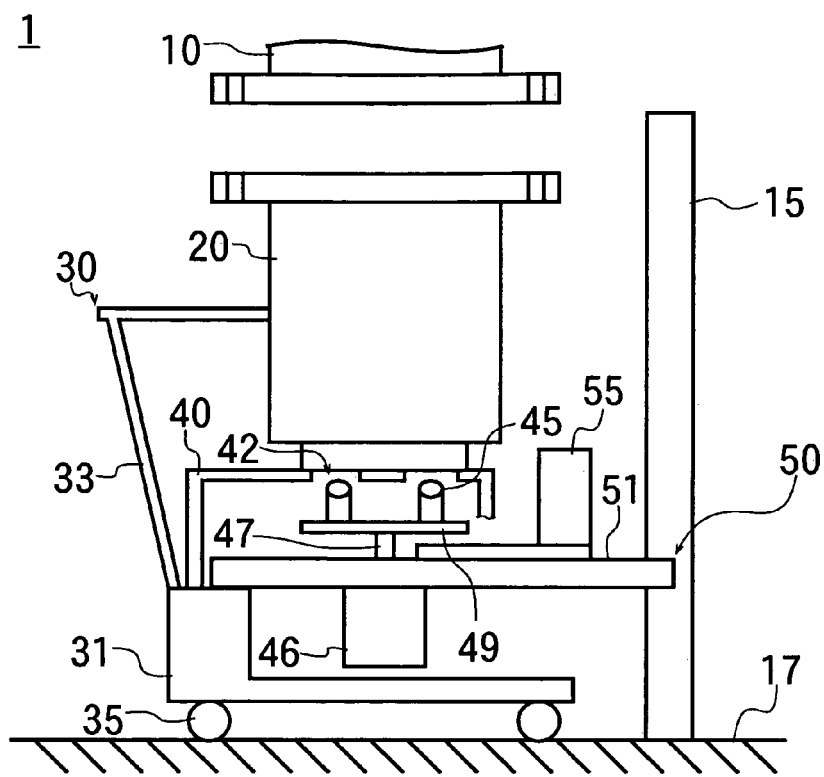
FIGS. 4(a) and 4(b) are diagrams illustrating a late stage of the process for exchanging processing chamber.
Figure 4B:
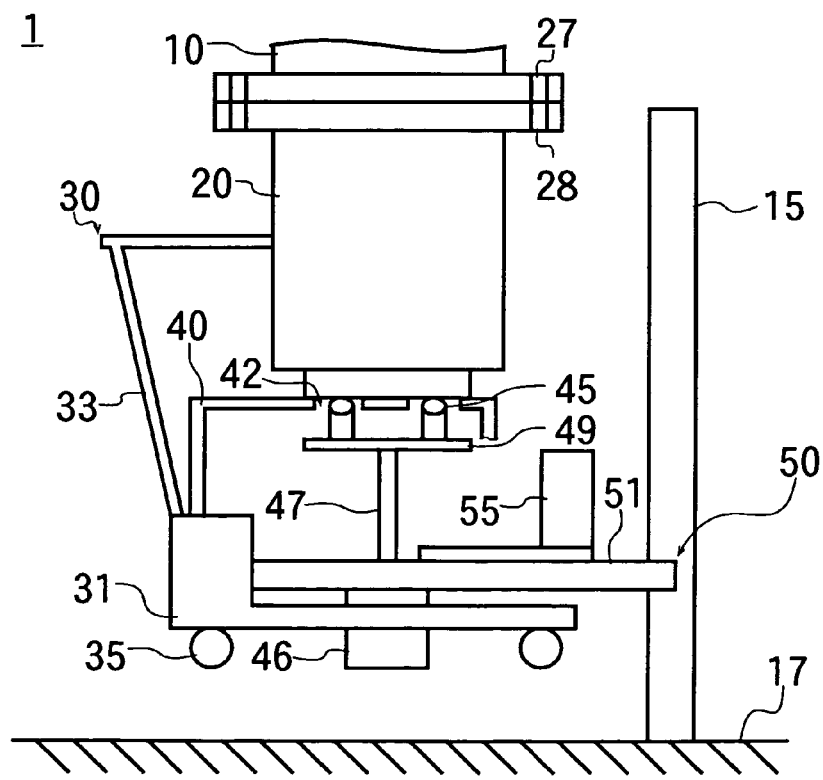
Figure 5:
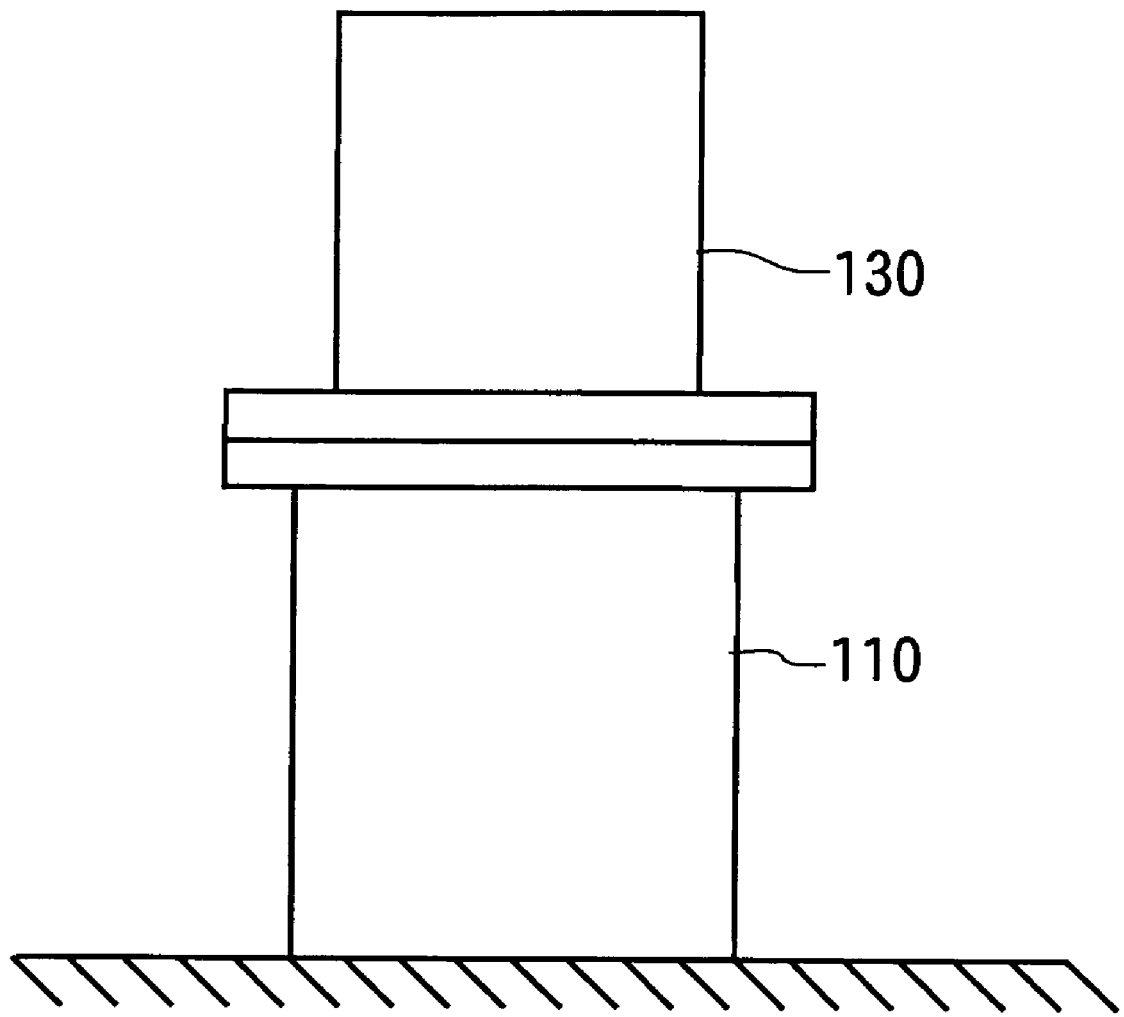
FIG. 5 is a diagram illustrating a vacuum processing apparatus of the conventional techniques.

By further lifting the ball 45, the processing chamber 20 is lifted together with the conveying means 30, and the opening portion of the processing chamber 20 comes into contact with the opening portion of the carrying-in-and-out chamber 10 so that the wheel 35 of the conveying means 30 floats above the floor surface 17 (FIG. 4(*b*)).

Since the ball 45 that supports the processing chamber 20 can rotate, it is possible to horizontally move the processing chamber 20 to some extent by pushing the processing chamber 20 as a result of the rotation of the ball 45.

Holes 27 and 28 are provided on the opening portion of the carrying-in-and-out chamber 10 and the opening portion of the processing chamber 20, respectively, and the holes 27 and 28 are used for attaching the positioning pin 19. By pushing the processing chamber 20 by hand, the processing chamber 20 is moved such that the hole 27 of the carrying-in-and-out chamber 10 and the hole 28 of the processing chamber 20 are connected to each other.

At this time, the wheel 35 of the conveying means 30 floats above the floor surface 17. Therefore, after the holes 27 and 28 are connected, moving (due to the rotation of the wheel 35 of the processing chamber 20) does not occur, and no positional slippage of the holes 27 and 28 occurs.

The positioning pin 19 is put through the connected holes 27 and 28 so that the opening portion of the processing chamber 20 and the opening portion of the carrying-in-and-out chamber 10 are in contact with each other and ultimately fixed to each other.

The applicator 29 is attached to the processing chamber 20; the piping of the evacuation system and the piping of the processing gas supply system are connected to the processing chamber 20; and the wiring connectors for supplying the electric power to the cooling device and the heating means are connected to a connector of an external power source.

When the inside of the processing chamber 20 is evacuated by the evacuation system, the processing chamber 20 and the carrying-in-and-out chamber 10 are connected in an airtight manner, as described above. When the block 55 is moved on the support plate 51 so as to be located below the attachment plate 49 after a vacuum atmosphere of a predetermined pressure is formed inside the processing chamber 20, as shown in FIG. 1, the processing chamber 20 is fixed to the framework 15 via the support plate 51. By carrying in a new substrate from the carrying-in-and-out chamber 10 by opening the partitioning valve, processes for etching or the like can be restarted.

The vacuum processing apparatus 1 of the present invention has a problem that particles generated during processing or carrying substrates tend to accumulate on the bottom wall of the processing chamber 20 since the processing chamber 20 is located below the carrying-in-and-out chamber 10. However, by providing an exhaust pipe in the bottom wall portion of the processing chamber 20, apart from the exhaust pipe for evacuating the inside of the processing chamber 20, so as to perform processing of the substrate while evacuating the inside of the processing chamber 20 also with that exhaust pipe, it is possible to exhaust the particles to the outside of the processing chamber 20.

When the carrying board is lowered, the internal space of the processing chamber 20 is shut off from the internal space of the carrying-in-and-out chamber 10 by interposing, for example, an o-ring between the lid portion of the carrying board and the opening portion of the processing chamber 20.

When a rotation shaft (not shown) is provided in the carrying board and the etching process is performed while rotating the substrate in a horizontal plane by rotating the rotation shaft, the processing gas uniformly reaches the substrate surface, which improves the etching efficiency.

In addition, a magnetic fluid sealing is used to hermetically seal a gap between the rotation shaft and the lid portion of the carrying board. Since a hermetically-sealing member made of rubber (an o-ring, for example) is not used, which is different from the conventional systems, the particles are not generated due to friction between the carrying board and the hermetically-sealing member even if the carrying board is rotated during processing of the substrate. Therefore, few particles accumulate inside the processing chamber 20 of the vacuum processing apparatus 1 of the present invention.

A case in which etching is performed in the processing chamber 20 was described above. However, there is no particular limitation on the processing performed in the processing chamber 20 so long as it is for processing substrates in a vacuum atmosphere. For example, it is also possible to form a film on the substrate surface with a thermal diffusion method, a thermal CVD method, sputtering, vapor deposition or the like.

There is no particular limitation on materials constituting the block 55 or the ball 45, and it is possible to use SUS (stainless steel) or the like.

Also, it is not required to connect the conveying means 30 to the carrying-in-and-out chamber 10 together with the processing chamber 20. For example, the conveying means 30 may be removed from the processing chamber 20 after the processing chamber 20 is placed on the ball 45 of the vertically moving mechanism 50. In such a case, it is possible to convey the processing chamber 20 with the conveying means by adopting a configuration in which the conveying means is disposed below the processing chamber 20 before the processing chamber 20 is separated from the carrying-in-and-out chamber 10 so that the processing chamber 20 is placed on the conveying means when the processing chamber is lowered, and the processing chamber 20 is fixed to the conveying means after being placed on the conveying means.

The invention claimed is:

1. A vacuum processing apparatus restable upon a floor, comprising:
    a processing chamber for processing a substrate in a vacuum atmosphere,
    wherein the processing chamber includes an upward-facing opening, substantially parallel to the floor,
    a carrying-in-and-out chamber that is connectable to the processing chamber at a position above the processing chamber such that the substrate is transferable between the carrying-in-and-out chamber and the processing chamber without being exposed to the external atmosphere, and wherein the substrate is transferable to the carrying-in-and-out chamber from an external atmosphere,
    wherein the carrying-in-and-out chamber includes a downward-facing opening, substantially parallel to the floor, in close contact with the upward-facing opening of the processing chamber,
    a support member that fixes the carrying-in-and-out chamber above the floor in a first position even during movement of other elements,
    a vertical moving mechanism, wherein the processing chamber is separable from the carrying-in-and-out chamber by the vertical moving mechanism so as to move in a vertically downward direction while maintaining a vertical positional alignment between the processing chamber and the carrying-in-and-out chamber; and
    wherein the processing chamber is attachable to the carrying-in-and-out chamber by the vertical moving mechanism moving the processing chamber in a vertically upward direction while maintaining the vertical positional alignment between the processing chamber and the carrying-in-and-out chamber,
    a horizontal conveying mechanism that is mechanically connected to the processing chamber such that the horizontal conveying mechanism remains connected to the processing chamber even in a state in which the processing chamber is connected to the carrying-in-and-out chamber, and
    wherein the horizontal conveying mechanism detaches from the vertical moving mechanism and horizontally conveys the processing chamber that has been removed from the carrying-in-and-out chamber, and that has been moved in the vertically downward direction, over the floor in contact therewith.

2. The vacuum processing apparatus according to claim 1, wherein a gas supply system is connected to the processing chamber in a state in which the processing chamber is connected to the carrying-in-and-out chamber, and
    wherein, when a radical gas and a processing gas of the gas supply system are supplied to the inside of the processing chamber, the processing gas and a substance to be processed on the surface of the substrate react with each other so that the substance is removed from the surface of the substrate.

3. The vacuum processing apparatus according to claim 1, wherein the vertical moving mechanism further includes a processing-chamber support fixed in a second position and comprising a vertically movable support shaft vertically underneath and aligned with the processing chamber, to lift the processing chamber upward into contact with an underside of the carrying-in-and-out chamber.

4. The vacuum processing apparatus according to claim 3, further comprising;
    rotatable balls disposed on an upper end of the vertically movable support shaft to contact the underside of the processing chamber,
    whereby the processing chamber is horizontally movable by hand.

5. The vacuum processing apparatus according to claim 3, wherein the processing-chamber support further comprises a horizontally-fixed support plate.

6. The vacuum processing apparatus according to claim 5, wherein the support shaft is connected to a cylinder and the upper end of the support shaft protrudes upward from the support plate.

7. The vacuum processing apparatus according to claim 1, comprising an exhaust pipe provided in the bottom wall portion of the processing chamber.

8. The vacuum processing apparatus according to claim 1, wherein the vertical moving mechanism is to move the processing chamber in a vertically downward direction while maintaining a vertical positional alignment between the processing chamber and the carrying-in-and-out chamber, to move the processing chamber in a vertically upward direction while maintaining the vertical positional alignment between the processing chamber and the carrying-in-and-out chamber, and to lift the processing chamber upward into contact with an underside of the carrying-in-and-out chamber.

9. The vacuum processing apparatus according to claim 8, wherein the horizontal conveying mechanism comprises a conveyor.

* * * * *